United States Patent
Hansen et al.

(10) Patent No.: US 9,709,873 B2
(45) Date of Patent: Jul. 18, 2017

(54) LASER APPARATUS WITH CASCADE OF NONLINEAR FREQUENCY MIXERS

(71) Applicant: DANMARKS TEKNISKE UNIVERSITET, Kgs. Lyngby (DK)

(72) Inventors: Anders Kragh Hansen, Roskilde (DK); Ole Bjarlin Jensen, Værløse (DK); Peter Eskil Andersen, Tølløse (DK); Paul Michael Petersen, Hillerød (DK)

(73) Assignee: DANMARKS TEKNISKE UNIVERSITET, Kgs. Lyngby (DK)

( * ) Notice: Subject to any disclaimer, the term of this patent is extended or adjusted under 35 U.S.C. 154(b) by 0 days.

(21) Appl. No.: 15/105,050

(22) PCT Filed: Dec. 15, 2014

(86) PCT No.: PCT/EP2014/077750
§ 371 (c)(1),
(2) Date: Jun. 16, 2016

(87) PCT Pub. No.: WO2015/091353
PCT Pub. Date: Jun. 25, 2015

(65) Prior Publication Data
US 2016/0320686 A1    Nov. 3, 2016

(30) Foreign Application Priority Data

Dec. 19, 2013   (EP) .................... 13198398

(51) Int. Cl.
*G02F 1/35* (2006.01)
*G01S 3/00* (2006.01)
(Continued)

(52) U.S. Cl.
CPC .......... *G02F 1/3532* (2013.01); *G02F 1/3501* (2013.01); *G02F 1/3534* (2013.01);
(Continued)

(58) Field of Classification Search
CPC ...... G02F 1/3501; G02F 1/353; G02F 1/3532; G02F 1/3534; G02F 1/3544;
(Continued)

(56) References Cited

U.S. PATENT DOCUMENTS 4,058,739 A * 11/1977 Bjorkholm ............ G02F 1/3534
330/4.5
5,206,868 A * 4/1993 Deacon ................. G02F 1/3501
359/326

(Continued)

FOREIGN PATENT DOCUMENTS

EP          2466372       6/2012
WO     WO 2013/135271    9/2013

OTHER PUBLICATIONS

Boyd et al; "Parametric interaction of focused gaussian light beams". Journal of Applied Physics, vol. 39, No. 8, Jul. 1968, pp. 3597-3639 (published by American Institute of Physics).

(Continued)

*Primary Examiner* — Loha Ben
(74) *Attorney, Agent, or Firm* — Michael Best & Friedrich LLP (57) ABSTRACT

A laser apparatus generating frequency converted light. Embodiments of the laser apparatus described herein apply a cascade of nonlinear frequency mixer for sum frequency generation (SFG) or difference frequency generation (DFG) between two frequency components of a spectrally combined laser beam with at least two spectral components originating from two respective laser sources, SFG of two frequency components beams offers up to a factor of four amplification of output power over SHG of a single laser beam.

15 Claims, 2 Drawing Sheets (51) Int. Cl.
*G01S 5/00* (2006.01)
*H01S 3/00* (2006.01)
*H01S 5/00* (2006.01)
*H01S 5/40* (2006.01)
*H01S 3/08* (2006.01)
*H01S 3/082* (2006.01)
*H01S 3/10* (2006.01)
*G02F 1/355* (2006.01)
*G02F 1/37* (2006.01)

(52) U.S. Cl.
CPC .......... *G02F 1/3544* (2013.01); *H01S 3/0092* (2013.01); *H01S 5/0092* (2013.01); *H01S 5/4012* (2013.01); *H01S 5/4087* (2013.01); *G02F 1/3551* (2013.01); *G02F 1/37* (2013.01); *G02F 2001/3507* (2013.01); *G02F 2001/3546* (2013.01); *H01S 3/0823* (2013.01); *H01S 3/08095* (2013.01); *H01S 3/10* (2013.01)

(58) Field of Classification Search
CPC .... G02F 1/3551; G02F 1/3553; G02F 1/3558; G02F 1/37; G02F 1/3775; G02F 2001/3507; G02F 2001/3542; G02F 2001/3546; H01S 3/0092; H01S 3/0809; H01S 3/082; H01S 3/0823; H01S 3/08095; H01S 3/0816; H01S 3/0811; H01S 3/10; H01S 3/108; H01S 3/23; H01S 5/0092; H01S 5/141; H01S 5/4012; H01S 5/4087
USPC .... 359/279, 326, 328–330, 337.5, 615, 618; 372/21, 22; 356/301
See application file for complete search history.

(56) References Cited

U.S. PATENT DOCUMENTS

| | | | |
|---|---|---|---|
| 5,345,457 A * | 9/1994 | Zenzie | H01S 3/108 372/100 |
| 5,912,910 A | 6/1999 | Sanders et al. | |
| 6,441,948 B1 | 8/2002 | Wu et al. | |
| 7,961,378 B2 * | 6/2011 | Imai | G02F 1/3532 359/326 |
| 8,228,507 B2 * | 7/2012 | Hirano | B82Y 10/00 356/450 |
| 8,446,580 B2 * | 5/2013 | Cerullo | G01J 3/44 356/301 |
| 8,508,841 B2 * | 8/2013 | Chou | G02F 1/3501 359/328 |
| 9,029,775 B2 * | 5/2015 | Demers | G01J 3/10 250/339.07 |

OTHER PUBLICATIONS

Fluck et al; "Efficien second-harmonic generation by lens waveguiding in KNbO3 crystals". Optics Communications, North-Holland Publishing Co., Amsterdam, NL, vol. 147, No. 4-6, Feb. 15, 1998, pp. 305-308.

Müller et al; "Frequency-doubled DBR-tapered diode laser for direct pumping of Ti:sapphire lasers generating sub-20 fs pulses". Optics Express, US, Jun. 20, 2011, vol. 19, No. 13, pp. 1-8.

* cited by examiner

LASER APPARATUS WITH CASCADE OF NONLINEAR FREQUENCY MIXERS

CROSS-REFERENCE TO RELATED APPLICATIONS

This is a U.S. national stage entry of International Patent Application No. PCT/EP2014/077750, filed on Dec. 15, 2014, which claims priority to European Patent Application No. 13198398.3, filed on Dec. 19, 2013, the entire contents of all of which are fully incorporated herein by reference.

The present invention relates to a laser apparatus generating frequency converted light.

BACKGROUND OF THE INVENTION

Diode lasers output radiation at one frequency or frequency interval, further the diode laser may emit radiation at a further frequency or frequency interval, but that frequency, frequencies or frequency interval may not be the desired frequency interval. For example, when a diode laser is used for pumping another laser, the output of the diode laser apparatus needs to match the acceptance frequency band of the laser to be pumped. Therefore there is a need for providing a system that allows the emitted radiation to be transformed to the desired frequency or frequency interval. The term frequency and wavelength may be interchanged throughout the description using the physical relation between frequency and wavelength.

The article "Frequency-doubled DBR-tapered diode laser for direct pumping of Ti-sapphire lasers generating sub-20 fs pulses" by André Müller et al., Optics Express, Vol. 19, 12156, 2011, has demonstrated that such a laser system can provide power levels that enable competitive direct optical pumping. The use of diode lasers as direct pump source for Ti:sapphire lasers allows the development of low-cost, ultrafast lasers with high efficiencies and small footprints. It will further be appreciated that frequency-doubled diode laser systems may be applied in a variety of alternative applications, e.g. as light source in a measuring system, display systems, medical and other diagnostic systems, etc.

Nevertheless, it is generally desirable to increase the output power of such a laser system.

Optical frequency mixing and, in particular, second harmonic generation (SHG), has been suggested to allow a single laser source to be used for multiple operations, e.g. as described in U.S. Pat. No. 6,441,948. Optical frequency mixing often attempts to generate higher power harmonics of solid state lasers such as Nd:YAG lasers in the deep UV range. This prior art document further discusses the importance of properly matching the refractive indeces for enhancing the non-linear process, the so-called phase matching condition. In particular, this prior art method proposes the use of a series of non-linear crystals wherein each crystal is independently adjusted to compensate for thermally induced phase mismatch. In this way, the phase mismatch is always less than $\pi$ in each crystal. Even though, this prior art method provides a compensation for thermally induced phase mismatch in the individual crystal, it remains a problem to provide an overall improvement of the conversion efficiency of the overall system.

D. Fluck and P. Günter, "Efficient second-harmonic generation by lens wave-guiding in KNbO3 crystals," Optics Communications, vol. 147, pp. 305-308, February 1998 discloses another example of a cascade of crystals performing second harmonic generation (SHG). The system of Fluck exploits the fact that a fixed phase relation between the fundamental beam and the SHG beam may be maintained.

A different optical frequency mixing technique involves the optical frequency mixing of laser beams from different sources where the incoming laser beams do not necessarily have the same frequency or are harmonics of each other. In particular, sum frequency generation (SFG) generates a combined laser beam from a first and a second laser beam such that the combined beam has a frequency given by the sum of the frequency of the first and second beams. However, as sum frequency generation requires an arrangement with two input beams, this technique has previously been regarded as more complex. In particular, in the SFG case and in contrast to the SHG, the total output power of the combined beam is a function of three phases, namely the respective phases of the incoming beams and of the combined beams. In contrast to the second harmonic generation, a fixed phase relation can thus not easily be maintained between all three beams.

In view of the prior art, it thus remains desirable to increase the output power of such a laser system.

SUMMARY

According to a first aspect, disclosed herein is a laser apparatus. Embodiments of the laser apparatus comprise:
  a first laser source operable to generate a first laser beam having a least a beam component having a first frequency;
  a second laser source operable to generate a second laser beam having a least a beam component having a second frequency;
  a beam combiner operable to combine the first and second laser beams into a combined initial laser beam comprising at least a frequency component having the first frequency, and a frequency component having the second frequency;
  one or more nonlinear frequency mixers operable to perform a frequency mixing process of a frequency component having the first frequency and a frequency component having the second frequency and resulting in at least a frequency component having a third frequency equal to a sum or a difference of the first and second frequencies; wherein the laser apparatus is configured to direct the combined initial laser beam through a first one of the one or more nonlinear frequency mixers resulting in a first frequency-mixed beam, the first frequency-mixed beam comprising a frequency component having the first frequency, a frequency component having the second frequency, and a frequency component having the third frequency; wherein the laser apparatus is further configured to direct the resulting first frequency-mixed beam along an intermediate beam path to a subsequent nonlinear frequency mixer chosen from the first and another one of the one or more nonlinear frequency mixers, resulting in a second frequency-mixed beam comprising at least an output frequency component having at least said third frequency;
  an adjustable dispersive element configured to change an optical path length of the intermediate beam path of the first frequency-mixed beam so as to compensate for dispersion along at least the intermediate beam path; wherein the adjustable dispersive element is operable to adjust a relative phase relation between the first, the second, and the third frequency components of the first frequency-mixed beam.

Hence, embodiments of the laser apparatus described herein apply a cascade of nonlinear frequency mixers for sum frequency generation (SFG) or difference frequency generation (DFG) between two frequency components of a spectrally combined laser beam with at least two spectral components originating from two respective laser sources, SFG of two frequency components beams offers up to a factor of four amplification of output power over SHG of a single laser beam.

It has surprisingly been found that optimization in the case of SFG and DFG can be performed even without a fixed phase relation of the incoming beams. To the knowledge of the inventors, the use of a dispersive element in a cascade in a way that does not fix the relation between the phases of the interacting frequency components has not been previously described in this context.

Accordingly, the inventors have further realised that a proper compensation for any dispersion of both fundamental beams and of the frequency-mixed beam may be obtained by inserting a dispersive element in the intermediate beam path between two consecutive passes of the beam through a single nonlinear frequency mixer or between a pair of respective nonlinear frequency mixers. It has turned out that such a dispersive element may be adjusted such that dispersion incurred not only within the nonlinear crystals but also in the passage of the light from one crystal to the next may efficiently be compensated for. In general, the two fundamental frequency components of the initial beam may have significantly different wavelengths and be subject to different dispersion along the intermediate path between the pair of nonlinear frequency mixers or between consecutive passes through the same nonlinear frequency mixer. Considering also the frequency-mixed SFG (or DFG) beam, there are three beams which each have their own phase.

The inventors have realised that, even though a fixed relation cannot be maintained between all three beam components using a dispersive element, such a dispersive element may still be adjusted so as to optimize the output power of the laser apparatus, because the dispersive element serves as a dispersion compensating element in the optical setup. The total output power of the third frequency component is a function of the first, second and third phases, each being a function of an adjustable parameter of the adjustable dispersive element.

To this end, the dispersive element may be an adjustable dispersive element allowing the dispersion imposed by the dispersive element to be adjusted. Such an adjustment may be performed during manufacturing and/or subsequently. If performed during manufacturing, the adjustable dispersive element may be fixed in the selected configuration after performing the adjustment so as ensure a stable dispersion adjustment. Hence, in such embodiments, once adjusted and fixed, further adjustment of the adjustable dispersive element is prevented. Alternatively, the adjustable dispersive element may be configured to be subsequently adjusted, either manually or automatically. To this end, the adjustable dispersive element may comprise a set screw or similar element for adjusting the dispersion imposed by the dispersive element. In some embodiments, the adjustable dispersive element may be operable to selectively change a difference in respective optical beam path lengths of the first, second and third frequency components of the first frequency-mixed beam.

The adjustable dispersive element may be operable to adjust the phase relation between the first, second and third frequency components of the first frequency-mixed beam so as to adjust (in particular, increase or even maximise) the power of the third frequency component generated by the subsequent frequency mixing process and, in particular, to obtain constructive interference when the first frequency-mixed beam passes through the subsequent nonlinear frequency mixer. Such an adjustment may be performed by monitoring the total output power of third frequency component while adjusting the adjustable element and by selecting a setting of the adjustable dispersive element for which the monitored output power is at least approximately maximised. In particular, the inventors have realised that the dispersive element may be configured such that the phase of the net SFG or DFG electric field generated in the first nonlinear frequency mixer is equal to the phase of the net SFG or DFG electric field generated in the subsequent nonlinear frequency mixer, thus yielding full constructive interference.

In addition to the phase matching condition in each nonlinear frequency mixer, embodiments of the laser system compensate for the dispersion between the nonlinear frequency mixers and at any optical elements in the beam paths. To this end, the adjustable dispersive element may be configured to compensate for a combined effect of dispersion within the nonlinear frequency mixers, dispersion in any optical elements situated in the intermediate beam path and dispersion in any gases, such as air, along the intermediate beam path. Consequently, there are fewer design restrictions when manufacturing the laser apparatus, e.g. in terms of maximum distance between the frequency mixers, vacuum requirements or the number or type of optical elements, such as lenses or mirrors.

Each nonlinear frequency mixer may be a nonlinear crystal, such as a periodically poled crystal and/or a birefringent crystal and/or a waveguide and/or a photonic crystal and/or non-linear fibre or any combinations thereof. Each frequency mixer may comprise a nonlinear material such as crystal materials lacking inversion symmetry. The crystal may be a bulk crystal or a waveguide. The subsequent nonlinear frequency mixer may be the first nonlinear frequency mixer or another one of the one or more nonlinear frequency mixers, different from the first nonlinear frequency mixer. Accordingly, in some embodiments, the first and subsequent nonlinear frequency mixers are embodied as a single nonlinear crystal and the laser apparatus may comprise one or more optical elements, such as reflective elements, e.g. mirrors, configured to redirect the frequency-mixed beam from an output of the nonlinear crystal to an input of the nonlinear crystal. It will further be appreciated that the laser apparatus may comprise a cascade of more than two nonlinear frequency mixers and a respective dispersive element between each pair of consecutive nonlinear frequency mixers.

Generally the first and the subsequent nonlinear frequency mixers are each operable to perform a frequency mixing process involving the same fundamental frequencies, namely the frequency of the original laser beams, and resulting in the same combined frequency, namely the sum or difference of frequencies of the original laser beams. Generally, the first, second and third frequencies are present in both the first and the second frequency-mixed beam, but the third frequency may be more prominent in the second frequency-mixed beam than in the first frequency-mixed beam, i.e. a greater fraction of the total power of the second frequency mixed beam is associated with the third frequency than is the case for the first frequency-mixed beam. Generally, the first and second frequencies are different from each other. In some embodiments, the frequency mixing process is a sum frequency generation (SFG) process, i.e. the one or more nonlinear frequency mixers are operable to perform a sum frequency generation process of a frequency component having the first frequency and a frequency component having the second frequency and resulting in at least a frequency component having a third frequency equal to a sum of the first and second frequencies. In an alternative embodiment, the frequency mixing process is a difference frequency generation (DFG) process, i.e. the one or more nonlinear frequency mixers are operable to perform a difference frequency generation process of a frequency component having the first frequency and a frequency component having the second frequency and resulting in at least a frequency component having a third frequency equal to a difference of the first and second frequencies.

The dispersive element may provide a change in the optical path lengths in a variety of ways. In some embodiments, the adjustable dispersive element defines an adjustable optical path through a dispersive medium, such as a gas, where the dispersive element defines a beam pass through said gas, the beam path having an adjustable length. In some embodiments, the dispersive medium has a temperature-dependent dispersion; and the adjustable dispersive element comprises a temperature control element operable to adjust the temperature of the dispersive medium. In alternative embodiments, the dispersive medium has a dispersion dependent on a magnitude of an applied electric field, and the adjustable dispersive element comprises electrodes for applying an adjustable electrical field to the dispersive medium. In yet an alternative embodiment, the dispersive medium comprises an elastically deformable dispersive member, and the laser apparatus comprises an actuator operable to selectively deform the deformable dispersive member.

In some embodiments, the adjustable dispersive element comprises a transmissive plate, e.g. a transmissive plate having two parallel side faces, positioned in the beam path of the first frequency-mixed beam and defining an adjustable angle between the transmissive plate and a beam axis of the frequency-mixed beam. Generally reference to an element being positioned in the beam path of a beam is intended to refer to a position of said element such that the beam impinges on the element.

The adjustable dispersive element may be a separate component or integrated into one or more of the other optical components of the laser apparatus. For example, the dispersive element may be formed by one or more of the frequency-mixing elements. When the frequency mixing element is a periodically poled crystal comprising layers with alternate orientation in a birefringent material and when the layers are formed such that the beam intersects with the layers at an angle different from the layer normal, the dispersion that occurs at the surface of the crystal may be adjusted by rotating the crystal relative to the laser beam and/or by displacing the crystal laterally relative to the laser beam. Accordingly, in some embodiments, one or more of the nonlinear frequency mixers comprise a periodically poled crystal configured to provide a position-dependent or angle-dependent dispersion and wherein the dispersive element comprises said periodically poled crystal and an actuator operable to selectively translate or rotate the periodically nonlinear crystal relative to the beam path of the frequency-mixed beam The dispersion adjustment may be performed by adjusting the orientation or lateral position of the first crystal in a cascade of crystals and/or by adjusting the orientation or lateral position of a subsequent crystal in a cascade of crystals.

In some embodiments, the laser apparatus comprises a focussing element operable to converge the first frequency-mixed beam onto the subsequent nonlinear frequency mixer, thus increasing the conversion efficiency of the subsequent nonlinear frequency mixer. The focussing element may be a reflective or a transmissive element, e.g. a curved mirror or a lens. While lenses as the re-focusing optics are usable as well, the use of curved mirrors, e.g. spherical mirrors, may help to avoid chromatic aberrations, thus allowing the SFG (or DFG) and fundamental frequency components to co-propagate better and re-focus in the same plane in the subsequent nonlinear frequency mixer, thus aiding the SFG or DFG process. As the focussing element, such as a focussing mirror or a lens, normally introduces dispersion, the use of an adjustable dispersive element as described herein for compensating any such dispersion is particularly advantageous.

In some embodiments, the laser apparatus comprises a collimating element operable to direct the first frequency-mixed beam onto the adjustable dispersive element as a collimated beam. The laser apparatus may thus further comprise a focussing element operable to receive the collimated beam from the dispersive element and to converge the collimated beam onto the subsequent nonlinear frequency mixer. The collimating element and/or the focussing element may be a transmissive element, e.g. a lens.

In some embodiments, the beam combiner may be a spectral beam combiner such as a volume Bragg grating. The laser apparatus may further comprise a focussing element operable to converge the spectrally combined beam onto the first nonlinear frequency mixer. The focussing element may be a transmissive or a reflective element. In some embodiments, the laser apparatus further comprises first and second collimating elements each operable to direct one of the first and second laser beams towards the beam combiner as a respective first and second collimated beam. Again, the collimating elements may be transmissive.

In some embodiments, one or each laser source may comprise a diode laser, a DPSS laser or a fibre laser. In some embodiments, the diode laser is a tapered diode laser comprising a ridge waveguide and a tapered section. In alternative embodiments, the diode laser is a different type of diode laser, such as a broad area laser, a master oscillator power amplifier (MOPA), a α-DFB laser or similar lasers. Diode lasers having a well-defined dominant lobe and high output power, e.g. tapered diode lasers, are particularly well-suited in connection with embodiments of the laser apparatus described herein. In some embodiments, the or each diode laser emits radiation in the near-infrared region, e.g. in the range between 800 nm and 1200 nm, and the third frequency lies within the green part of the visible spectrum, i.e. between 495 nm and 600 nm. The diode laser may provide an output of more than 1 watt. The diode laser may provide any power level such as 2 watt, 3 watt, 4 watt, 5 watt or any other suitable value. In some embodiments, the laser apparatus is operable to output a continuous wave laser beam at or including the third frequency.

The present invention relates to different aspects including the laser apparatus described above and in the following, a method of operating a laser apparatus, and corresponding methods, devices, and/or product means, each yielding one or more of the benefits and advantages described in connection with the first mentioned aspect, and each having one or more embodiments corresponding to the embodiments described in connection with the first mentioned aspect and/or disclosed in the appended claims.

According to further aspects, disclosed herein is a method of operating a laser apparatus and a method of manufacturing a laser apparatus, each method comprising:
  generating a first laser beam by a first laser source, the first laser beam having a least a beam component having a first frequency;
  generating a second laser beam by a second laser source, the second laser beam having a least a beam component having a second frequency;
  combining the first and second laser beams into a combined initial laser beam comprising at least a frequency component having the first frequency, and a frequency component having the second frequency;
  providing one or more nonlinear frequency mixers operable to perform a frequency mixing process of a frequency component having the first frequency and a frequency component having the second frequency and resulting in at least a frequency component having a third frequency equal to a sum or a difference of the first and second frequencies;
  directing the combined initial laser beam through a first one of the one or more nonlinear frequency mixers resulting in a first frequency-mixed beam, the first frequency-mixed beam comprising a frequency component having the first frequency, a frequency component having the second frequency, and a frequency component having the third frequency;
  directing the resulting first frequency-mixed beam along an intermediate beam path to a subsequent nonlinear frequency mixer chosen from the first and another one of the one or more nonlinear frequency mixers, resulting in a second frequency-mixed beam comprising at least an output frequency component having at least said third frequency;
  adjusting an optical path length of the intermediate beam path of the first frequency-mixed beam so as to compensate for dispersion along at least the intermediate beam path.

In some embodiments, the laser apparatus comprises one or more additional optical elements such as a spatial filter, such as a slit, an optical fiber, and/or the like, configured to spatially filter at least a portion of one of the beams; one or more reflective and/or transmissive elements such as lenses, mirrors or the like.

BRIEF DESCRIPTION OF THE FIGURES

The systems and methods according to embodiments of the invention will now be described in more detail with regard to the accompanying figures. The figures show several ways of implementing the present invention but are not to be construed as being intended to exclude other possible embodiments falling within the scope of the attached claim set. Throughout the drawings, like reference numerals refer to like or corresponding components, elements, and features.

DETAILED DESCRIPTION

Figure 1:
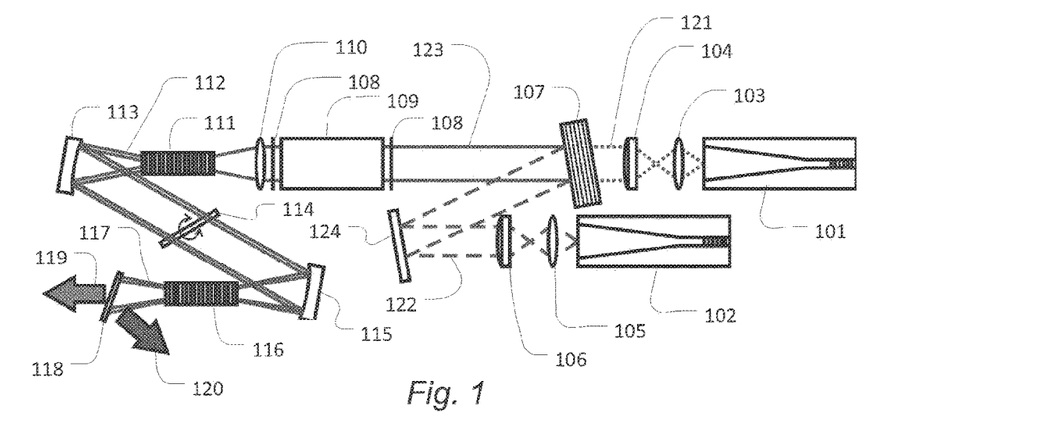
FIG. 1 shows a schematic illustration of an embodiment of a laser apparatus.

FIG. 1 shows a schematic illustration of an embodiment of a laser apparatus.

The laser apparatus comprises two laser sources 101 and 102, each emitting a laser beam 121 and 122, respectively, having respective wavelengths $\lambda_1$ and $\lambda_2$. In the present example, each laser source is a tapered diode laser comprising a ridge waveguide section and a tapered amplifier section. Hence, each laser source is controllable by two injection currents, also referred to as ridge and tapered currents, respectively. In this particular example, each laser source is a tapered diode with an embedded DBR grating. Such a tapered diode laser is capable of emitting more than 10 W laser light in a narrow wavelength region, in this example in a region around 1062 nm. Generally, tapered diode laser sources have previously been found to be suitable as an input for frequency doubling, in the present example to generate green light, e.g. as described in WO 2013/135271, the entire contents of which are hereby incorporated by reference. It will be appreciated, however, that alternative laser sources may be used, e.g. other types of diode lasers such as other types of diode lasers emitting light in the near-infrared region. Moreover, it will be appreciated that the two laser sources may be of the same type or of different types. In particular, the laser sources are operable to emit light at different wavelengths ($\lambda_1 \neq \lambda_2$) which may be far from or close to one another. In some embodiments, the first and second wavelengths are not harmonics of one another.

The laser apparatus further comprises respective pairs of lenses 103, 104 and 105, 106, respectively, configured to collimate the light emitted by the respective laser sources 101 and 102, as the light emitted from the tapered diode laser is typically astigmatic, i.e. the focus positions for the horizontal and vertical axes are different. The light from both laser sources is then directed towards a spectral beam combiner 107, in this example a volume Bragg grating. To this end, the laser beam 121 from laser source 101 is transmitted through the beam combiner, while the laser beam 122 from the other laser source is directed to and reflected by the volume grating of the spectral beam combiner 107. To this end, the laser apparatus comprises a mirror 124 for redirecting the laser beam 122. The output beam 123 from the spectral beam combiner 107 is thus a spectrally combined beam comprising two wavelength components $\lambda_1$ and $\lambda_2$.

The spectrally combined beam 123 is then passed through an optical isolator 109 sandwiched between two $\lambda/2$ plates 108 in order to avoid undesired feedback to the tapered diode lasers which might otherwise destabilize the wavelength and/or impose damage to the lasers. It will be appreciated that other embodiments of the laser apparatus may comprises other means for preventing undesired feedback to the laser diode, if such prevention is necessary or desired. In some embodiments, no such means may be required at all.

Figure 2:
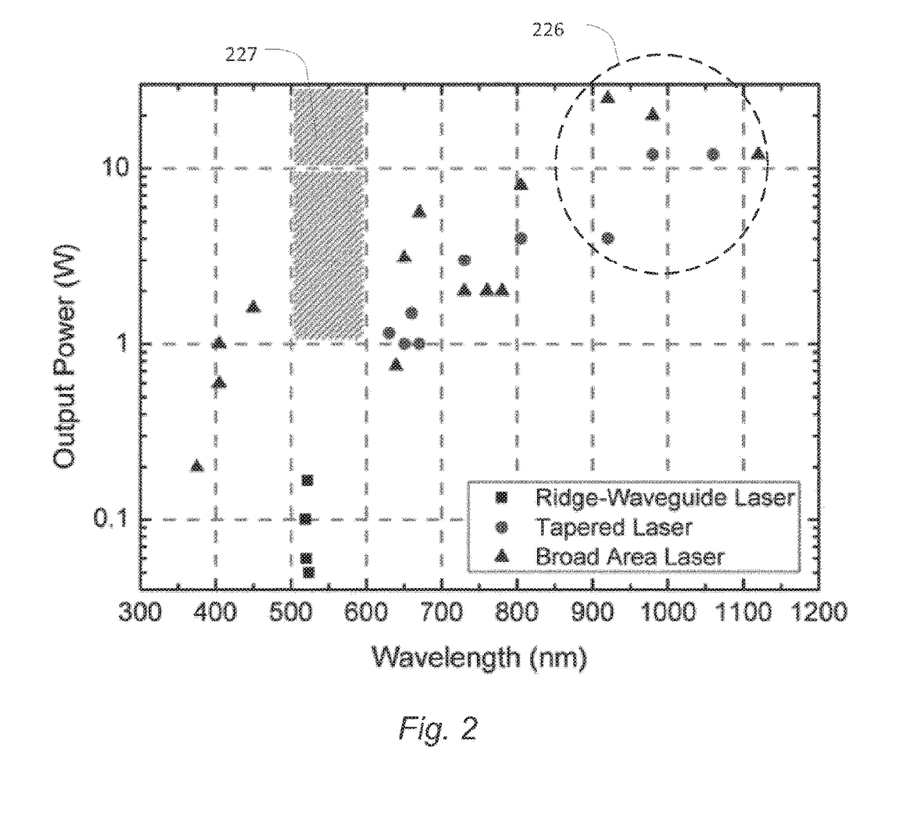
FIG. 2 illustrates the relation between wavelength and output power in existing diode lasers.

The laser apparatus comprises a first nonlinear crystal 111 and a focussing lens 110 adapted to focus the spectrally combined beam 123 as an initial beam onto the nonlinear crystal 111. The lenses 103-106 and the isolator 109 are positioned in the beam path between the laser sources 101 and 102 and the first nonlinear crystal 111. The nonlinear crystal 111 is arranged to perform sum frequency generation of the two fundamental wavelength components $\lambda_1$ and $\lambda_2$ of the incoming spectrally combined beam resulting in a frequency-mixed beam 112 which comprises three wavelength components, namely the fundamental wavelengths $\lambda_1$ and $\lambda_2$ as well as wavelength $\lambda_3$ resulting from the SFG process $\omega_3 = \omega_1 + \omega_2$, where the $\omega_i$ are the angular frequencies corresponding to the respective wavelengths $\lambda_i$. When both fundamental wavelengths are in the region between 990 nm and 1200 nm, the SFG component $\lambda_3$ will thus be in the green and yellow regions of the visible spectrum between 495 nm and 600 nm. As is illustrated by FIG. 2, a laser apparatus may thus be provided where laser diodes outputting light in the near-infrared region having high output power, e.g. in the region indicated by the dashed circle 226 to produce green light at output powers larger than 1 W and even larger than 10 W, as indicated by the hashed region 227 where there are currently no diode laser sources available that produce green light at such a high output power.

Again referring to FIG. 1, the frequency mixed beam 112 is redirected by curved mirrors 113 and 115 to a second nonlinear crystal 116 operable to perform the same sum frequency generation process $\omega_3 = \omega_1 + \omega_2$ as the first nonlinear crystal 111. Hence, the second nonlinear crystal 116 receives and outputs wavelength components $\lambda_1$, $\lambda_2$ and $\lambda_3$, but where the energy-content of the SFG component $\lambda_3$ in the frequency-mixed output beam 117 from the nonlinear crystal 116 is larger than in the frequency-mixed beam 112. The laser apparatus further comprises a dichroic mirror 118 or another frequency-selective element arranged to receive the frequency-mixed output beam 117 and to allow the desired wavelength component $\lambda_3$ (119) pass while reflecting the residual, non-converted fundamental wavelength components $\lambda_1$ and $\lambda_2$ (120). In the example of FIG. 1, the laser apparatus comprises two separate crystals, thus allowing a selective temperature control of each crystal individually and independently from each other so as to compensate for a local absorption-induced heating. It is another advantage of having two separate crystals, that the placement of the various optical elements is facilitated and that it is relatively easy to prevent laser light to be returned back into the laser diodes. However, it will be appreciated that, in alternative embodiments of a laser system, the laser beam may be sent through the same crystal multiple times, so as to provide a cascade of frequency-mixing processes with fewer crystals.

The laser apparatus further comprises an adjustable transmissive plate 114 or other adjustable dispersive element in the beam path of the frequency-mixed beam 112 between the first and second nonlinear crystals 111 and 116, respectively. In the example of FIG. 1, the transmissive plate 114 is positioned in the beam path between the curved mirrors 113 and 115. To this end, the curved mirror 113 is operable to collimate the output beam from the first nonlinear crystal 111, and the curved mirror 115 is operable to focus the collimated beam onto the second nonlinear crystal 116.

The transmissive plate 114 is rotatably mounted such that its angle relative to the beam axis is adjustable. The transmissive plate may be a plane glass plate or another plate from a dispersive medium. For example, the transmissive plate may be a plane plate of BK7 glass with a thickness of 3 mm. By adjusting the angle of the transmissive plate relative to the beam axis, the optical beam path for the different wavelength components are altered, thus allowing the transmissive plate to be adjusted such that it compensates for dispersion in the nonlinear crystals, the curved mirrors 113 and 115 as well as along the beam path between the nonlinear crystals, as will be described in greater detail below.

Figure 3:
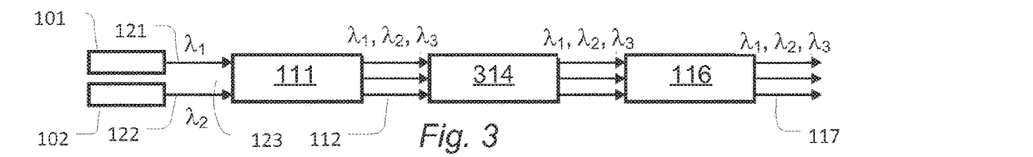
FIGS. 3 and 4 are block-diagrammatical illustrations of respective embodiments of a laser apparatus.

FIG. 3 is a block-diagrammatical illustration of an embodiment of a laser apparatus. The laser apparatus comprises two laser sources 101 and 102, each emitting a laser beam 121 and 122, respectively, having respective wavelengths $\lambda_1$ and $\lambda_2$, e.g. as described in connection with FIG. 1. The laser apparatus further comprises a first frequency mixing element 111 such as a nonlinear crystal as described above. The laser beams 121 are 122 are efd into the first frequency mixing element 111 as a combined initial beam 123. The frequency mixing element 111 is arranged to perform a frequency mixing process of the two fundamental wavelength components $\lambda_1$ and $\lambda_2$ of the incoming spectrally combined beam resulting in a frequency-mixed beam 112 which comprises three wavelength components, namely the fundamental wavelengths $\lambda_1$ and $\lambda_2$ as well as wavelength $\lambda_3$ resulting from the frequency mixing process. The frequency mixing process may be a sum frequency generation (SFG) where the relation between the wavelength components is $\omega_3 = \omega_1 + \omega_2$, where the $\omega_i$ are the angular frequencies corresponding to the respective wavelengths $\lambda_i$. Alternatively, the frequency mixing process may be a difference frequency generation (DFG) where the relation between the wavelength components is $\omega_3 = \omega_1 - \omega_2$ or $\omega_3 = \omega_2 - \omega_1$.

The apparatus further comprises an adjustable dispersive element 314 and a second non-linear frequency mixing element 116. The dispersive element 314 receives the frequency-mixed beam 112 generated by the first nonlinear frequency mixer 111. The frequency mixed beam 112 comprises three wavelength components, namely the fundamental wavelength components $\lambda_1$ and $\lambda_2$ as well as the frequency-mixed (SFG or DFG) component $\lambda_3$ generated by the first nonlinear frequency mixer. The adjustable dispersive element 314 affects the phase differences between the respective wavelength components $\lambda_1$, $\lambda_2$, and $\lambda_3$ and forwards the thus phase-compensated beam to the second nonlinear frequency mixer 116.

In addition to the phase matching condition that must still be satisfied within each crystal, the dispersive element thus compensates for any dispersion between the fundamental and SFG beams that arises between the pair of crystals. This dispersion arises due to the specifics of the poling at the ends of the crystals, dispersion in air and dispersion in the re-focusing optics used.

In general, the two fundamental beams may have significantly different wavelengths and be subject to different dispersion between the pair of crystals. Considering also the SFG beam, there are three beams which each have their own phase. A fixed relation cannot be maintained between all three beams using simply a rotated plane plate or a similarly adjustable dispersive element. However, the inventors have realised that, while rotation of a plane plate cannot establish a fixed phase relation of all three beams relative to each other, it enables, by appropriate angular adjustment, suitable power optimization, thus it serves as the dispersion compensating element in the optical setup. At this optimum the phase of the net SFG electric field generated in the first crystal is equal to the phase of the net SFG electric field generated in the second crystal, yielding full constructive interference as in the SHG case.

The mechanism by which the plane plate or other adjustable dispersive element operates may be illustrated as follows:

Let $\phi_1(\theta)$, $\phi_2(\theta)$ and $\phi_3(\theta)$ denote the phases of the fundamental beam of wavelength $\lambda_1$, the fundamental beam of wavelength $\lambda_2$, and the sum frequency beam of wavelength $\lambda_3$, respectively, at the entrance of the second crystal and as a function of the angle $\theta$ of the transmissive plate relative to the beam axis (for other types of adjustable dispersive elements, the parameter $\theta$ is replaced by another suitable quantity indicative of the adjustable parameter). Since the phase of the SFG E-field generated by the fundamental beams is the sum of the phases of the fundamental beams, the total output power $P_{SFG}$ is then a function of $\phi_1+\phi_2-\phi_3$. Although $\phi_1$ and $\phi_2$ differently on $\theta$, the optimum phase mismatch can still be reached by adjusting $\theta$.

It is worthwhile noting that the use of an adjustable transmissive plate as a dispersion compensating element has previously been suggested in the context of a cascade of crystals performing second harmonic generation (SHG), see e.g. D. Fluck and P. Günter, "Efficient second-harmonic generation by lens wave-guiding in KNbO3 crystals," Optics Communications, vol. 147, pp. 305-308, February 1998.

However, the principle of the dispersion compensation in the SHG case is rather different: Let $\phi1(\theta)$ and $\phi2(\theta)$ denote the phases of the fundamental beam and the second harmonic beam, respectively, at the entrance of the second crystal, both including all sources of dispersion and being functions of the tilt angle of the transmissive plate, $\theta$. Since the phase of the SHG E-field generated by the fundamental beam is twice that of the fundamental beam, the total output power $P_{2\omega}$ is then a function of $2\phi_1-\phi_2$. Note that the maximum power is not achieved exactly at $2\phi_1-\phi_2=0$ because of the Gouy phase shift, which is also in the single crystal case a well-known phenomenon and is also included in the theory of Boyd and Kleinman (see G. Boyd and D. Kleinman, "Parametric Interaction of Focused Gaussian Light Beams," Journal of Applied Physics, vol. 39, pp. 3597-3639, July 1968). Regardless, maximum constructive interference between the E-field contribution of the first crystal and the E-field contribution of the second crystal is achieved for some specific value of $2\phi_1-\phi_2$. Since $\phi_1$ and $\phi_2$ exhibit a slightly different dependence on $\theta$, the optimal phase can be reached simply by adjusting $\theta$. However, as mentioned above, in the SFG case, the total output power is a function of three phases, each being a function of the adjustable parameter $\theta$. A fixed relation can thus not be maintained between all three beams using a single adjustable parameter, but the inventors have found that adjustment of dispersive element allows power optimization as in the SHG cascade case.

An additional difference between the SHG and SFG cases concerns the phase correlation properties of the two fundamental fields. Due to phase noise, the phases of the fundamental fields will experience random jumps. In the SHG case a jump of $\Delta\phi_1$ in the fundamental phase will be associated simply with a jump in the phase of the SHG field of $\Delta\phi_2=2\Delta\phi_1$, thus maintaining the fixed phase relation between the two beams. However, the SFG case is different: A jump in the phase of one fundamental beam of $\Delta\phi_1$ will be associated with a jump in SFG phase of $\Delta\phi_3=\Delta\phi_1$ and, similarly, a jump of phase of the other fundamental beam of $\Delta\phi_2$ will be associated with a jump in SFG phase of $\Delta\phi_3=\Delta\phi_2$. This means that a jump in phase of either fundamental beam changes the phase relation of the three beams, unlike the SHG case. The quantity $\phi_1+\phi_2-\phi_3$ will, however, remain unchanged and the dispersion compensation obtained for one set of phases $(\phi_1, \phi_2)$ will remain optimal for $(\phi_1+\Delta\phi_1, \phi_2)$, $(\phi_1, \phi_2+\Delta\phi_2)$ and $(\phi_1+\Delta\phi_1, \phi_2+\Delta\phi_2)$. For this reason, the dispersion compensation method does not require phase correlation between the fundamental fields. It can also be noted that the same non-zero phase mismatch optimum as in the SHG case exists because of the Gouy phase shift.

Therefore, it has been found that a cascade enhancement effect comparable to the one demonstrated for SHG also applies to SFG of spectrally combined beams, in principle yielding for two crystals and two lasers an enhancement of up to a factor of sixteen over a single-laser/single-crystal setup. Accordingly, embodiments of the laser apparatus described herein apply a crystal cascade for sum frequency generation between two spectrally combined beams. SFG of two spectrally combined laser beams is a technique that already in itself offers up to a factor of four amplification of output power over SHG of a single laser beam.

The adjustment of the transmissive plate (or other adjustable dispersive element) may be performed based on a measurement of the output power of the laser apparatus while adjusting the dispersive element. To this end, a beam splitter with high transmittance at the wavelength $\lambda_3$ may be inserted in the beam path of the output beam 117 so as to pick up a small amount of output beam 117 for monitoring the power of the output beam by a detector. In an embodiment, where the dispersive element is a transmissive plate, the plate may be tilted to Brewster's angle and the tilt angle may subsequently be fine-tuned so as to tune the dispersion and optimize the output power. The adjustable dispersive element 314 may then be adjusted while monitoring the measured output power so as to maximize the measured output power. Prior to adjusting the dispersive element, both crystals may individually be adjusted to their respective phase-matching temperatures. In some embodiments, such an adjustment may be performed during manufacture of the laser apparatus. In some embodiments, the laser apparatus may comprise a control unit receiving a signal indicative of the output power. The control unit then performs a suitable control method, e.g. a control loop, and generates a control signal for automatically adjusting the adjustable dispersive element, e.g. by means of a suitable actuator, motor, piezoelectric element, heater, and/or the like. The control unit may be implemented as a programmable microprocessor and/or any other suitable processing unit implemented by hardware and/or software. It may be integrated into a housing together with the remaining components of the laser apparatus or implemented as a separate unit.

Figure 4:
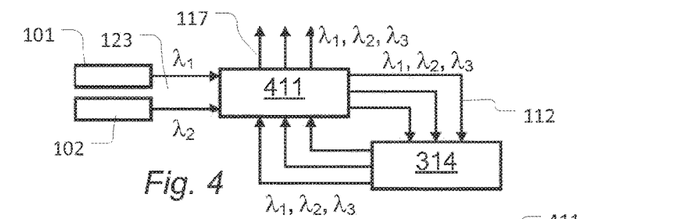

FIG. 4 shows an block-diagrammatical illustration of another example of a laser system. In the example of FIG. 4, the first and subsequent nonlinear frequency mixers are embodied as a single nonlinear crystal 411.

As in the previous example, the laser system comprises first and second laser sources 101 and 102, respectively that generate first and second laser beams 121 and 122, respectively, that are fed into the nonlinear frequency mixing element 411 as a combined initial beam 123, all as described in connection with FIG. 1 or FIG. 3. The laser apparatus of FIG. 4 differs from the apparatus of FIG. 3 in that the laser apparatus of FIG. 4 only comprises a single frequency mixing element 411. The frequency mixing element receives the combined initial beam 123 and generates the frequency-mixed beam 112 as described above. The frequency-mixed beam is then fed through the dispersive element 314 and back into the same frequency-mixing element 411. To this end, the laser apparatus may comprise one or more mirrors or other redirecting elements operable to cause the spectrally combined laser beam 112 to pass through the same frequency-mixing element 411 twice (or even more times).

The adjustable dispersive element 314 is positioned in the beam path of the spectrally combined beam 112 between two consecutive passages through the frequency-mixing element 411. In the example of FIG. 4, the second pass through the frequency-mixing element 411 results in the frequency mixed output beam 117. Embodiments of a laser system where the beam passes through the same crystal multiple times allow a particularly compact design and requires fewer crystals.

In the following, various alternative embodiments of a laser apparatus will be described. As these embodiments have many general features in common, these will not be described in detail again.

Figure 5:
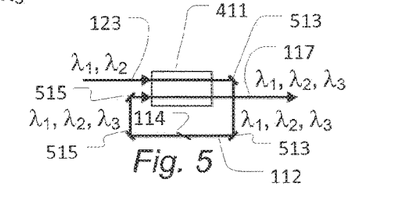
FIGS. 5 and 6 show schematic illustrations of examples of a laser system where the first and second nonlinear frequency mixers are embodied as a single nonlinear crystal.
Figure 6:
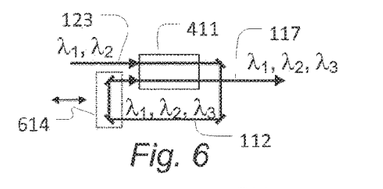

FIGS. 5-6 show examples of a laser system where the first and subsequent nonlinear frequency mixers are embodied as a single nonlinear crystal 411.

In the example of FIG. 5, the spectrally combined input beam 123 is fed through nonlinear crystal 411 performing sum or difference frequency generation resulting in the frequency mixed beam 112 as described herein. The frequency-mixed beam 112 is then redirected by mirrors 513 through a transmissive plate 114 as described herein and then, by mirrors 515 back though the crystal 411. The second pass through the crystal then results in the frequency mixed output beam 117. As in the example of FIG. 1, one or more of the mirrors 513 and 515 are operable to refocus the beam 112 onto the crystal 411. Both passages through the crystal are along the same direction, i.e. during both passages the beam enters the crystal through the same input face and exits it through the same output face. In other embodiments, both beams may propagate in opposite directions, i.e. still substantially parallel a common axis, but in opposite directions.

The example of FIG. 6 is similar to the example of FIG. 4, but where the transmissive plate 114 is replaced by an adjustable path length of the beam path between the two passages through the crystal 411. To this end, the apparatus comprises an actuator 614 operable to displace mirrors 415 along a predetermined direction along a portion of the beam path of beam 112. When the beam 112 along the adjustable beam path passes through a gas, such as air, the change in path length allows an adjustment of the relative dispersion of the different wavelength components.

FIGS. 7-11 show schematic illustrations of parts of respective embodiments of a laser apparatus using different types or arrangements of dispersive elements. In the examples of FIGS. 7-11, the first and second nonlinear frequency mixers are embodied as separate crystals 111 and 116, respectively, as described in connection with the example of FIG. 1. However, in the examples of FIGS. 7-8, the transmissive plate 114 is replaced or supplemented by alternative/additional adjustable dispersive elements.

Figure 7:
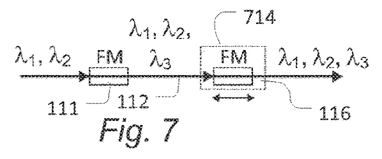
FIGS. 7-11 show schematic illustrations of parts of respective embodiments of a laser apparatus using different types of dispersive elements.
Figure 8:
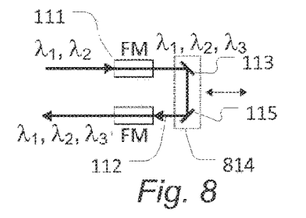

In the examples of FIGS. 7 and 8, the adjustable dispersion is obtained by changing the path length of the frequency-mixed beam 112 generated by the first crystal 111 towards the subsequent crystal 116. In particular, the apparatus of FIG. 7 comprises an actuator 714 operable to displace the second crystal 116 so as to change the distance between the first and second crystals across which the beam 112 travels. It will be appreciated that, alternatively or additionally, the position of the first crystal may be changed. It will be appreciated that the actuator 714 may be operable to displace both the second crystal and a refocussing optical element positioned in the beam path of beam 112 so as to maintain proper re-focussing. In the example of FIG. 8, the beam 112 from the first crystal 111 is redirected towards the second crystal via mirrors 113 and 115. The apparatus further comprises an actuator 814 operable to displace the mirrors 113 and 115 so as to adjust the length of the beam path of beam 112.

Figure 9:
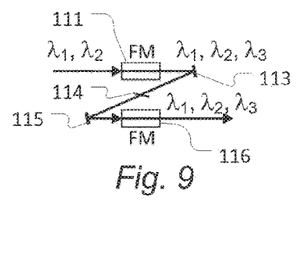
Figure 10:
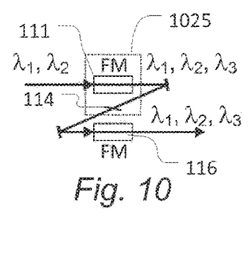
Figure 11:
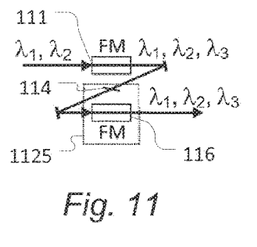

FIGS. 9-11 schematically illustrates an example of a laser apparatus similar to the one shown in FIG. 1, i.e. comprising two separate crystals 111 and 116, redirecting and refocussing mirrors 113 and 115 and an adjustable transmissive plate 114, all as described in connection FIG. 1. In the examples of FIG. 9-11, the redirecting mirrors 113 and 115 are arranged such that angle of incidence (relative to the surface normal of the mirror) of the beam onto the mirrors is small so as to reduce the beam astigmatism incurred if the mirrors are spherically curved in order to refocus the beam into the second crystal.

In the example of FIG. 10, the laser apparatus comprises a temperature-stabilised mounting plate 1025 onto which the first crystal 111 and the dispersive element 114 are mounted so as to maintain the first crystal and the dispersive element at a sufficiently stable temperature. It will be appreciated that the second crystal 116 may also be mounted on a temperature-stabilised plate so as to allow independent temperature control of both crystals.

The laser apparatus of FIG. 11 is similar to the apparatus of FIG. 10, but where the dispersive element 114 is mounted on a common temperature-stabilised plate 1125 with the second crystal 116 instead. It will be appreciated that, in yet alternative embodiments, the dispersive element 114 may be temperature stabilised independently of both crystals 111 and 116.

Figure 12:
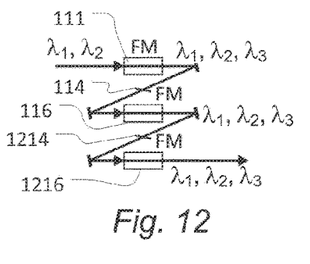
FIG. 12 shows a schematic illustration of parts of an embodiment of a laser apparatus comprising a cascade of three nonlinear frequency mixers.

The previous examples of a laser apparatus all comprise two crystals or cause the laser beam to pass through the same crystal twice. However, it will be appreciated that other embodiments may comprise a cascade of more than two frequency-mixing processes, e.g. by providing three or more separate crystals and/or by causing the beam to propagate through the same crystal multiple times. FIG. 12 shows a schematic illustration of parts of an embodiment of a laser apparatus comprising a cascade of three nonlinear crystals 111, 116, and 1216, respectively, arranged in series with respect to the spectrally combined beam. Adjustable dispersive elements 114 and 1214 are positioned between respective pairs of consecutive crystals. Dispersive element 114 is positioned in the beam path between crystals 111 and 166, while dispersive element 1214 is positioned in the beam path between crystals 116 and 1216.

Figure 13:
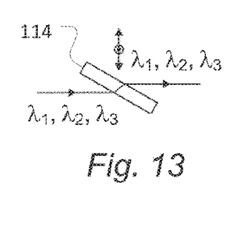
FIGS. 13-14 schematically illustrate examples of an adjustable transmissive plate.
Figure 14:
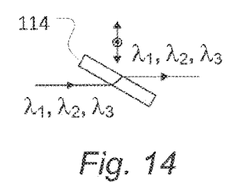

FIGS. 13-14 schematically illustrate examples of the arrangement of an adjustable transmissive plate relative to the beam path. FIG. 13 shows a side view of a transmissive plate 114 in the beam path of the frequency-mixed beam 112 as described herein. In the example of FIG. 13, the frequency-mixed beam is vertically polarised (i.e. in the plane of the drawing). FIG. 14 shows a top view of a transmissive plate 114 in the beam path of the frequency-mixed beam 112 as described herein. In the example of FIG. 14, the frequency-mixed beam is horizontally polarised (i.e. in the plane of the drawing). Hence, in both examples the transmissive plate is tilted relative to the beam 112 around an axis that is normal to the beam path and normal to the direction of polarisation. In both cases, the beam 112 impinges on the transmissive plate 114 at an angle that is close to Brewster's angle, thus resulting in a reduction of reflection losses. In both examples, the dispersion may be adjusted by rotating the transmissive plate 114 around an axis in the plane of the drawing (i.e. the plane defined by the direction of polarisation and the beam path) or normal to the plane of the drawings.

Although the present invention has been described in connection with the specified embodiments, it should not be construed as being in any way limited to the presented examples. The scope of the present invention is to be interpreted in the light of the accompanying claim set. In particular, embodiments of the laser system have mainly been described with reference to an SFG process. However, it will be appreciated that, in alternative embodiments, the crystals may perform a DFG process instead, in which case $\omega_3 = \omega_1 - \omega_2$ or $\omega_3 = \omega_2 - \omega_1$.

Embodiments of the invention described herein may be used in a variety of applications such as for pumping another laser, spectroscopy applications, display applications and medical applications, including diagnostics and treatment of diseases e.g. by photo-coagulation of blood vessels in the retina and treatment of vascular lesions.

The individual elements of an embodiment of the invention may be physically, functionally and logically implemented in any suitable way such as in a single unit, in a plurality of units or as part of separate functional units. The invention may be implemented in a single unit, or be both physically and functionally distributed between different units and processors.

In the context of the claims, the terms "comprising" or "comprises" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention.

Furthermore, individual features mentioned in different claims, may possibly be advantageously combined, and the mentioning of these features in different claims does not exclude that a combination of features is not possible and advantageous.

The invention claimed is:

1. A laser apparatus comprising:
a first laser source operable to generate a first laser beam having a least a beam component having a first frequency;
a second laser source operable to generate a second laser beam having a least a beam component having a second frequency;
a beam combiner operable to combine the first and second laser beams into a combined initial laser beam comprising at least a frequency component having the first frequency, and a frequency component having the second frequency;
one or more nonlinear frequency mixers operable to perform a frequency mixing process of a frequency component having the first frequency and a frequency component having the second frequency and resulting in at least a frequency component having a third frequency equal to a sum or a difference of the first and second frequencies; wherein the laser apparatus is configured to direct the combined initial laser beam through a first one of the one or more nonlinear frequency mixers resulting in a first frequency-mixed beam, the first frequency-mixed beam comprising a frequency component having the first frequency, a frequency component having the second frequency, and a frequency component having the third frequency; wherein the laser apparatus is further configured to direct the resulting first frequency-mixed beam along an intermediate beam path to a subsequent nonlinear frequency mixer chosen from the first and another one of the one or more nonlinear frequency mixers, resulting in a second frequency-mixed beam comprising at least an output frequency component having at least said third frequency;
an adjustable dispersive element configured to change an optical path length of the intermediate beam path of the first frequency-mixed beam so as to compensate for dispersion along at least the intermediate beam path; wherein the adjustable dispersive element is operable to adjust a relative phase relation between the frequency components having the first, the second, and the third frequencies of the first frequency-mixed beam.

2. A laser apparatus according to claim 1, wherein the adjustable dispersive element is operable to selectively change a difference in respective optical path lengths of the first, second and third frequency components of the first frequency-mixed beam.

3. A laser apparatus according to claim 1, wherein the adjustable dispersive element is operable to adjust a relative phase relation between the first, second, and third frequency components of the first frequency-mixed beam so as to adjust a power of the third frequency component when the first frequency-mixed beam passes through the subsequent nonlinear frequency mixer.

4. A laser apparatus according to claim 1, wherein the adjustable dispersive element is configured to compensate for a combined effect of dispersion within the nonlinear frequency mixers, dispersion in any optical elements position in the intermediate beam path and dispersion in any gases along the intermediate beam path.

5. A laser apparatus according to claim 1, wherein the adjustable dispersive element defines an adjustable optical path through a dispersive medium.

6. A laser apparatus according to claim 5, wherein the adjustable dispersive medium is a gas, including air, and the dispersive element defines a beam pass through said gas, the beam path having an adjustable length.

7. A laser apparatus according to claim 5, wherein the dispersive medium has a temperature-dependent dispersion; and the adjustable dispersive element comprises a temperature control element operable to adjust the temperature of the dispersive medium.

8. A laser apparatus according to claim 5, wherein the dispersive medium has a dispersion dependent on a magnitude of an applied electric field, and the adjustable dispersive element comprises electrodes for applying an adjustable electrical field to the dispersive medium.

9. A laser apparatus according to claim 1, wherein the dispersive element comprises a transmissive plate positioned in the intermediate beam path of the first frequency-mixed beam and defining an adjustable angle between the transmissive plate and a beam axis of the first frequency-mixed beam.

10. A laser apparatus according to claim 1, wherein the dispersive element comprises an elastically deformable dispersive member and an actuator operable to selectively deform the deformable dispersive member.

11. A laser apparatus according to claim 1, wherein one or more of the nonlinear frequency mixers comprise a periodically poled crystal configured to provide a position-dependent or angle-dependent dispersion and wherein the dispersive element comprises said periodically poled crystal and an actuator operable to selectively translate or rotate the periodically nonlinear crystal relative to the beam path of the frequency-mixed beam.

12. A laser apparatus according to claim 1, comprising a focussing element operable to converge the first frequency-mixed beam onto the subsequent nonlinear frequency mixer.

13. A laser apparatus according to claim 1, comprising a collimating element operable to direct the first frequency-mixed beam onto the adjustable dispersive element as a collimated beam.

14. A laser apparatus according to claim 13, comprising a focussing element operable to receive the collimated beam from the dispersive element and to converge the collimated beam onto the subsequent nonlinear frequency mixer.

15. A method of operating a laser apparatus, the method comprising:
- generating a first laser beam by a first laser source, the first laser beam having a least a beam component having a first frequency;
- generating a second laser beam by a second laser source, the second laser beam having a least a beam component having a second frequency;
- combining the first and second laser beams into a combined initial laser beam comprising at least a frequency component having the first frequency, and a frequency component having the second frequency;
- providing one or more nonlinear frequency mixers operable to perform a frequency mixing process of a frequency component having the first frequency and a frequency component having the second frequency and resulting in at least a frequency component having a third frequency equal to a sum or a difference of the first and second frequencies;
- directing the combined initial laser beam through a first one of the one or more nonlinear frequency mixers resulting in a first frequency-mixed beam, the first frequency-mixed beam comprising a frequency component having the first frequency, a frequency component having the second frequency, and a frequency component having the third frequency;
- directing the resulting first frequency-mixed beam along an intermediate beam path to a subsequent nonlinear frequency mixer chosen from the first and another one of the one or more nonlinear frequency mixers, resulting in a second frequency-mixed beam comprising at least an output frequency component having at least said third frequency;
- adjusting a relative phase relation between the frequency components having the first, the second, and the third frequency by adjusting an optical path length of the intermediate beam path of the first frequency-mixed beam so as to compensate for dispersion along at least the intermediate beam path.

* * * * *